United States Patent [19]

Barnes et al.

[11] Patent Number: 5,518,547
[45] Date of Patent: May 21, 1996

[54] METHOD AND APPARATUS FOR REDUCING PARTICULATES IN A PLASMA TOOL THROUGH STEADY STATE FLOWS

[75] Inventors: Michael S. Barnes, San Francisco, Calif.; Dennis K. Coultas, Hopewell Junction, N.Y.; John C. Forster, San Francisco, Calif.; John H. Keller, Newburgh, N.Y.; Thomas Wicker, Vallejo, Calif.

[73] Assignee: International Business Machines Corporation, Armonk, N.Y.

[21] Appl. No.: 178,386

[22] Filed: Dec. 23, 1993

[51] Int. Cl.⁶ .................................................. C23C 16/00
[52] U.S. Cl. .................................................. 118/723 MA
[58] Field of Search .......................... 118/723 I, 723 IR, 118/723 E, 723 ER, 723 ME, 723 MR, 723 MA, 723 MW, 723 AN; 204/298.37; 156/345

[56] References Cited

U.S. PATENT DOCUMENTS

| 4,727,293 | 2/1988 | Asmussen et al. . | |
|---|---|---|---|
| 4,891,095 | 1/1990 | Ishida et al. . | |
| 4,977,352 | 12/1990 | Williamson . | |
| 4,980,896 | 12/1990 | Forsyth et al. . | |
| 5,021,114 | 6/1991 | Saito et al. . | |
| 5,032,202 | 7/1991 | Tsai et al. ................................ | 156/345 |
| 5,032,205 | 7/1991 | Hereshkowitz et al. ................ | 156/345 |
| 5,133,825 | 7/1992 | Hakamata et al. ...................... | 156/345 |
| 5,178,739 | 1/1993 | Barnes et al. . | |
| 5,203,960 | 4/1993 | Dandl ...................................... | 156/345 |
| 5,216,329 | 6/1993 | Pelletier ............................... | 315/111.14 |
| 5,304,277 | 4/1994 | Ohara et al. ............................ | 165/345 |
| 5,304,279 | 4/1994 | Coultas et al. .......................... | 156/345 |
| 5,329,205 | 7/1994 | Goebel et al. ......................... | 315/11.21 |
| 5,346,579 | 9/1994 | Cook et al. ............................. | 156/345 |

FOREIGN PATENT DOCUMENTS

0379828A2  8/1990  European Pat. Off. .

OTHER PUBLICATIONS

Sasaki, Japanese Laid-Open No. 2-17636, Patent Abstracts of Japan, Section E, Section No. 909, vol. 14, No. 161, p. 51, (Mar. 28, 1990).

Michael S. Barnes, et al.; "Transport of Dust Particles in Glow–Discharge Plasmas"; Physical Review Letters, vol. 68, No. 3, Jan. 20, 1992, pp. 313–316.

Primary Examiner—Mary Wilczewski
Assistant Examiner—Brian K. Dutton
Attorney, Agent, or Firm—Whitham, Curtis, Whitham & McGinn; Alison Mortinger

[57] ABSTRACT

A method and apparatus for reducing particulates in a plasma tool using steady state flows includes a device, operatively coupled to a housing in which an object to be processed is positioned, for generating a plasma flow adjacent the object toward a pumping aperture. A pumping mechanism pumps a medium adjacent the object. The medium supports the plasma and entrains particulates in the plasma away from the object and out the pumping aperture. Magnetic fields, produced by multipole magnets forming a ring cusp, are preferably used to produce the plasma flow which is directed radially away from the object to be processed. In a second embodiment, an array of magnets which form a line cusp is provided to produce an opening through which plasma will flow.

14 Claims, 10 Drawing Sheets

METHOD AND APPARATUS FOR REDUCING PARTICULATES IN A PLASMA TOOL THROUGH STEADY STATE FLOWS

BACKGROUND OF THE INVENTION

Field of the Invention

The present invention generally relates to a method and apparatus for reducing particulate contamination of semiconductor wafers during plasma processing and, more particularly, to removing particulates in a plasma tool through steady state flows and to a system for removing particulates in a plasma using a multipole magnetic field. The magnetic field produces a plasma flow and continues the plasma flow through any stagnation point, towards an opening in the magnetic field, to drag entrained particulates through the opening for removal from the system. With the invention, particulates are reduced in a plasma (and thus the object being processed) by generation of the steady plasma flow.

Description of the Related Art

Semiconductor wafers, typically made of silicon (Si), are subjected to several processes during the manufacture of integrated circuits (ICs). Some of these processes involve a plasma (e.g., used in etching, plasma deposition and sputtering). Radio frequency (RF) and direct charge (DC) Glow discharge plasmas, for example, are extensively utilized in the manufacture of ICs. Both electropositive and electronegative gases are used to produce plasmas. Electronegative gases (i.e., those having a higher ion density than an electron density) such as $CF_4$, $CHF_3$, $Cl_2$, HBr or $O_2$, present difficult contamination problems for semiconductor manufacturers.

Contaminants (e.g., contaminating particulates) ranging in size from less than tenths of microns to several microns are produced or grown in the plasmas or "pulled in" (e.g., assimilated) from adjacent surfaces of a processing chamber or the object itself. The particulates normally have a negative charge, and are produced, for example, by negative ions which are trapped in the plasma by plasma sheaths. Plasma sheaths form where the plasma comes in contact with a solid and act as a boundary layer between the plasma and the solid surface. The size of the sheath is inversely related to plasma density.

Increasing densities of semiconductor circuits make contamination a serious problem to product reliability and may even be a barrier to achieving theoretically possible higher density circuits. Contamination by particulates also is a severe problem in the processing of semiconductor devices such as semiconductor wafers or the like. Indeed, for proper fabrication and processing of the semiconductor devices, the devices must be reliably cleaned of particulates to a size of approximately one-tenth (0.1) of a micron.

Particulate contamination is a major problem encountered during plasma processing of microelectronic materials. By some accounts, 50% of current semiconductor chip yield loss may be attributed to direct or indirect effects of particulate contamination during fabrication. This fraction is expected to increase as device dimensions are reduced in future technologies. Particles that reduce process yields today range in size from the macroscopic to the sub-micron size.

Particulate contamination also has an extremely deleterious effect on the performance and reliability of microelectronic devices produced by plasma etching or deposition. Particulate contamination can result in device failure, poor film quality, changes in material resistivity, and impurity permeation. Further, as device dimensions are reduced, tighter control of the etching profile requires ever more stringent restrictions on the allowable particle contamination number, density, and size. To meet these requirements, tightly controlled, clean rooms are required to avoid particle deposition on product surfaces during wafer transport and handling.

Improvements in clean room technology and in the handling of in-process substrates (for semiconductors and other applications) have reduced the once appreciable introduction of particulates onto substrates during non-process exposure such as wafer handling and transfer. Particulate formation during process steps, including plasma processing, may now contribute a significant fraction of total contamination exposure with corresponding yield reduction.

Additionally, the industry trend is towards integrated vacuum processing", or "multi-channel processing". Thus, surface contamination previously removed by wet or dry mechanical means will be more complex or impossible to remedy since it now requires removal of the substrate from the vacuum chamber. In multi-chamber tools, particulates which drop onto a wafer before, during, or at the completion of a process step may have an especially severe impact on subsequent process steps in that tool.

Recent studies have shown that certain etching plasmas can produce particulates which may be a significant source of product contamination and device failure. These experiments have shown that particles can be nucleated, grown, and suspended in a process plasma until they are significant in size. For example, particles are formed with sizes on the order of the submicron scale to hundreds of microns in diameter. The particles may ultimately fall onto devices being fabricated in the same manufacturing environment. If particles fall before or during film deposition or pattern transfer, then they can disrupt the process step. If the particulates fall at the end of a process step, the particulates may disrupt subsequent process steps. These contaminants often produce defects which affect the device yield, performance and reliability. Similar results have been observed in deposition type plasmas (e.g., PECVD Silane).

The effects of particulate contamination can be magnified when selective plasma etching processes are used. Certain plasma etching processes rely on a combination of feed gases and etching conditions to etch material surfaces on the wafer selectively. The chemical deformation of particulates which are etched at a slow rate in these highly selective plasmas results in micromasking, or an irregular surface often referred to as "grass". This spike or hill of unetched material will also degrade the device performance and reduce process yield.

The presence of these particulates is not always due to material flaking from chamber walls, but may also be due to gas phase processes such as homogeneous nucleation. This suggests that particle contamination problems may not be eliminated solely by rigorous attention to clean room techniques and frequent cleaning of manufacturing equipment. Instead, since the plasma itself can result in product contamination, this problem may pose a "base level" of contamination even with the highest clean room technology.

In a normal plasma, sheaths are formed with electric fields on the order of 100 V/cm. These sheaths form to reduce diffusion of very mobile electrons which have energies 5 to 10 times greater than that of the heavier ions in the plasma. Since the field in the sheaths retard the negative electrons, the low energy negatively charged particles are trapped in the plasma. As these particulates reach micron size, the ion drag forces push these particulates toward the plasma sheaths were they remain under normal plasma conditions. When plasma undergoes transitions in density caused, for example, by variations in the generator power, microarcs, or the plasma being turned off, these particulates can fall or are pulled to the wafer surface and adhere thereto.

In plasmas with magnetic surface confinement, i.e., multipole or cusp plasmas, the plasma is also bounded by the magnetic fields. In these plasmas shown in FIG. 1(b), the plasma is bounded by the magnetic field to a region which is slightly larger than the wafer being processed. The plasma is bounded by sheaths which prevent the particulates from leaving the plasma except during perturbations of the plasma density as previously described.

Further, it has been found that small variations in the surface adjacent to the plasma causes "particle traps" such as a small trench and a step. These surface variations can have a size as small as a few millimeters and particulates will be trapped in the sheath above these surface variations. Even the edge of the wafer being processed can cause particles to be trapped at the wafer's edge. Additionally, if the plasma density is slightly reduced above the center of the wafer, particles will be trapped above the wafer, thereby falling or being pulled toward the wafer when the plasma is turned off.

In view of the foregoing, it is therefore necessary to provide a way to reduce particle contamination on semiconductor wafers during plasma processing with a plasma tool.

SUMMARY OF THE INVENTION

It is therefore an object of the present invention to provide a method and apparatus for reducing particle contamination on wafers which may occur during plasma processing.

A second object of the invention is to provide an improved method and apparatus for reducing particulates in a plasma through generation of steady state flows.

It is a third object of the invention to remove particulates in a plasma by using a multipole magnetic field for entrainment of the plasma and gas flow and evacuation of particulates from the plasma.

The above described problems of the conventional systems have been overcome by the method and apparatus according to the present invention which is grounded on the realization by the present inventors that particulates in a plasma follow the bulk flow of the ions in the plasma.

Generally, according to the particulate reduction method of the invention, multipole magnetic fields are used for generating flows near the substrate (e.g., wafers) being processed. The inventors recognize that such multipole magnetic fields may be incidentally present in some plasma tools, such as planar inductive tools, e.g., the Tegal MPC tool, commercially available from Tegal, Inc. However, even assuming that these magnetic fields are present, the fields are not controlled, regulated or tailored in any manner near the object (e.g., a semiconductor wafer) being processed, to produce the plasma flows required for particulate reduction. This is a serious deficiency in that contaminants will be present on the wafer, thereby affecting its performance.

Plasma flow may also be produced by generating a plasma over the wafer, or using a diffusion plasma for producing plasma over the wafer, and by preventing plasma generation adjacent the wafer and between the wafer and a pumping aperture.

In view of the foregoing, according to a first embodiment of the present invention, magnetic fields are formed to produce a plasma flow which is directed radially away from an object to be processed. The magnetic fields are preferably formed by a plurality of multipole magnets.

According to a second embodiment of the present invention, magnetic fields are formed by an array of magnets which is provided to produce an opening through which plasma will flow. The array of magnets includes a line cusp arrangement of magnets.

With the invention, in a plasma confined by a multipole magnetic field, the plasma is confined away from the multipole structure between the magnetic cusps and extends out toward the structure near the cusps. Normally, the plasma flow toward these cusps is minimal due to the mirror effects of the cusp.

The present inventors have caused plasma flow through the pumping apertures in two ways: 1) by essentially pulling a magnetic cusp apart so that its respective halves are on opposite sides of these apertures, thereby greatly reducing the magnetic field and thus reducing the mirror effect of the weak cusp at the aperture; and 2) in another embodiment, the E×B plasma drift is used to cause the plasma to flow through the apertures.

Additionally, the plasma loss to the surface adjacent the wafer is used to enhance the flow. This is performed by using the magnetic field above this area to reduce the volume of plasma which can flow to this surface. Thus, a flow transverse to this surface is established.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF A PREFERRED EMBODIMENT OF THE INVENTION

Figure 1A:
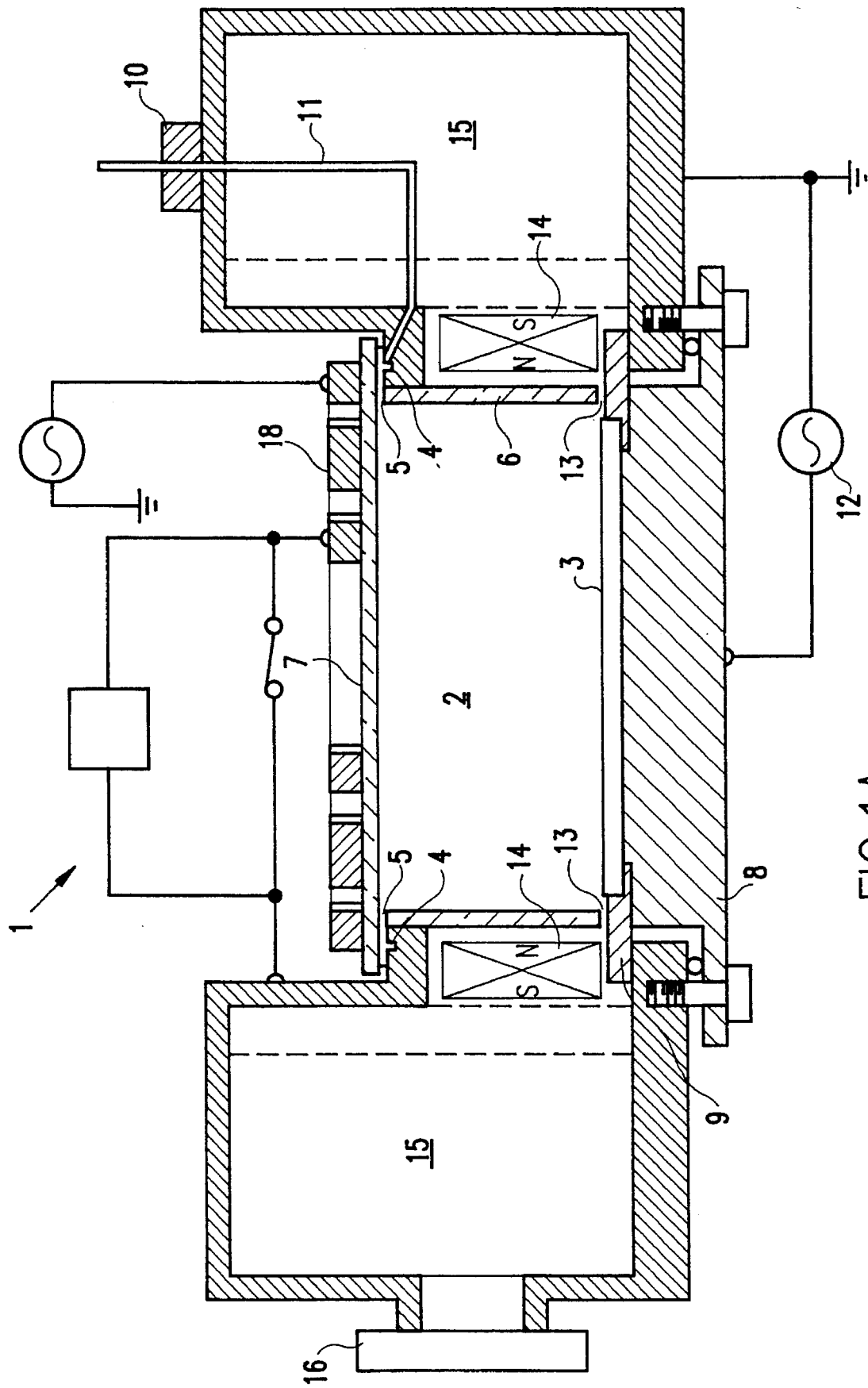
FIG. 1(a) is a cross-sectional, schematic drawing of a magnetically confined plasma in a known structure.
Figure 1B:
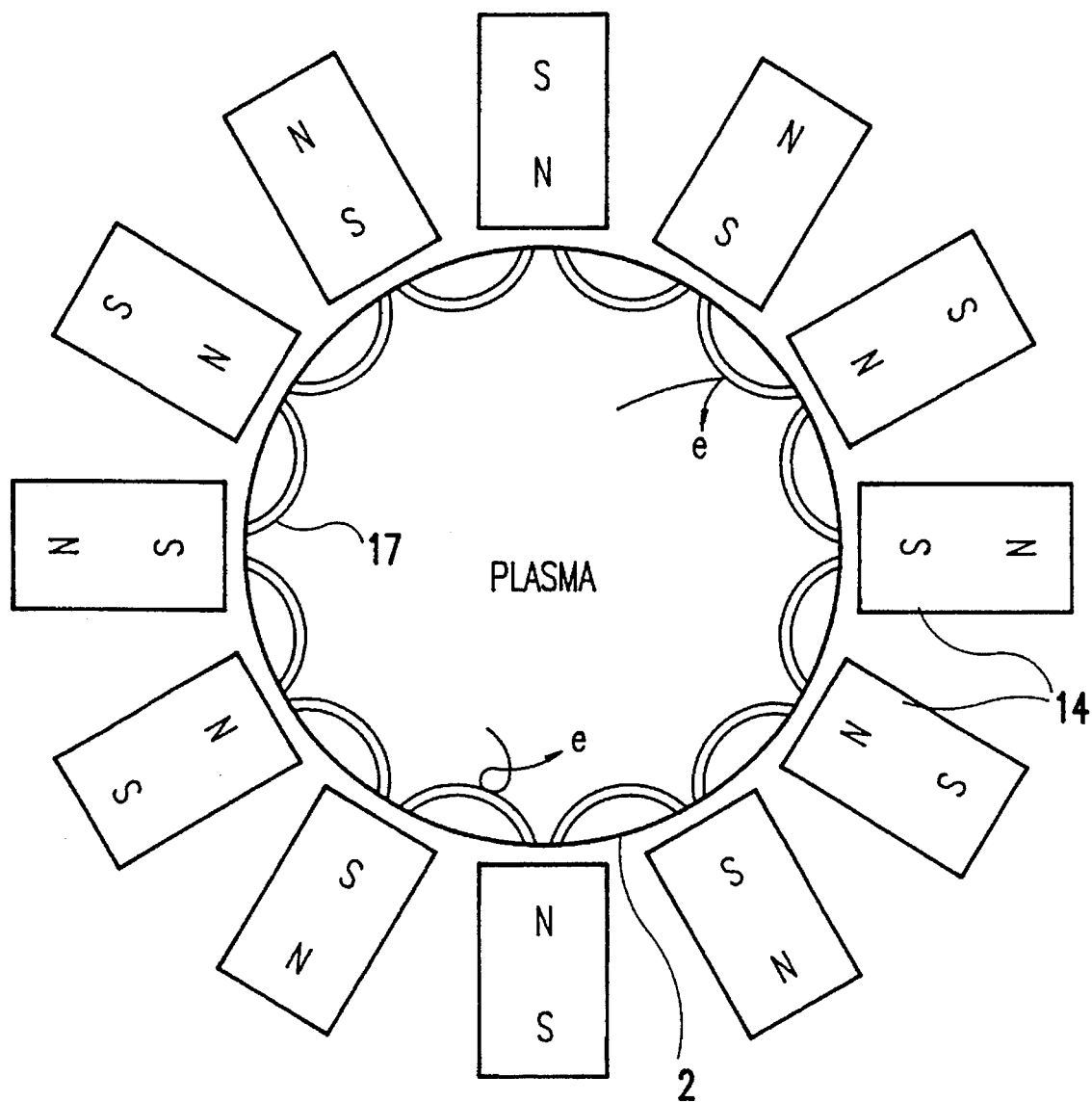
FIG. 1(b) is a cross-sectional view taken along line II—II of FIG. 1(a)

Referring now to the drawings, and more particularly to FIGS. 1(a)–1(b), an apparatus for use with a first embodiment of the present invention is shown. Generally, the invention is for use in a dry processing apparatus for plasma etching or deposition. An example of such a plasma tool is disclosed in European Patent Publication No. 0379828A2, corresponding to U.S. patent application Ser. No. 07/301,933, to Coultas et al., assigned to the assignee of the present application and incorporated herein by reference.

The plasma processing apparatus 1 includes a cylindrical, evacuated chamber 2 containing a workpiece 3 (e.g., a semiconductor wafer) for treatment with a plasma process. A gas is admitted to chamber 2 from a manifold 4 via an orifice 5. The gas is used to form a plasma for processing of wafer 3 by etching or deposition in a manner known in the art. A liner 6, preferably comprising a material which is substantially inert or noncontaminating to the plasma to be contained in the chamber 2, forms a cylindrical outer wall and contains the gas which is to be energized to form a plasma. A cover dielectric window 7 is also provided as shown in FIG. 1(a) such that the chamber is substantially surrounded by the cover 7, liner 6 and wafer 3. Wafer 3 is supported by a base 8 suitably configured to be a wafer electrode biased by an R.F. biasing source 12. A ring 9 separates the plasma from the surfaces below and retains the wafer 3 in the chamber.

Gas is admitted into the chamber through a gas input port 10, a gas input line 11, manifold 4 and an orifice 5. The gas to be exhausted from the chamber 2 passes through an orifice 13 at the base of liner 6 and multiple-magnetic-dipoles (e.g., multipoles) 14 into an exhaust vacuum pumping manifold 15 and out through port 16.

The multipoles are arranged around the periphery of liner 6 as shown in FIG. 1(b) and have their magnetic fields directed inwardly. With this arrangement, a wall of magnetic field is provided which repels electrons (e.g., "e" in FIG. 1(b)) back into the interior of the chamber 2, thereby increasing the uniformity of the plasma near the wafer 3.

As shown in FIG. 1(b), the magnetic field contains cusps 17 pointing towards the multipoles 14. As is known in the art, a radio frequency (RF) coil (e.g., designated by reference numeral 18 in FIG. 1(a)) is wound on top of cover 7 and is energized by an RF source (unreferenced in FIG. 1(a) but shown in the right-hand side of coil 18 as viewed. The other elements shown in FIG. 1(a) are not germane to the present invention and thus description thereof will be omitted.

The radio frequency (R.F.) induction field conventionally applied to the chamber 2, generates a plasma in the gas. The plasma is confined within the external wall in the chamber 2 by the magnetic dipoles providing a surface magnetic field for confining the plasma. The surface magnetic field is confined to the space adjacent to the external wall. An R.F. generator provides an R.F. generated bias to the workpiece. The chamber is lined with a material inert to a plasma or noncontaminating to the workpiece, and the induction source in the form of a spiral induction coil or the like is located on the exterior of the liner material on the opposite side of the chamber from the workpiece. Delivery of and distribution of the gas to the chamber is uniform about the periphery of the chamber and is provided by a manifold located about the periphery of the chamber. An orifice for admitting gas from the manifold to the chamber is formed around the periphery of the chamber.

Figure 2A:
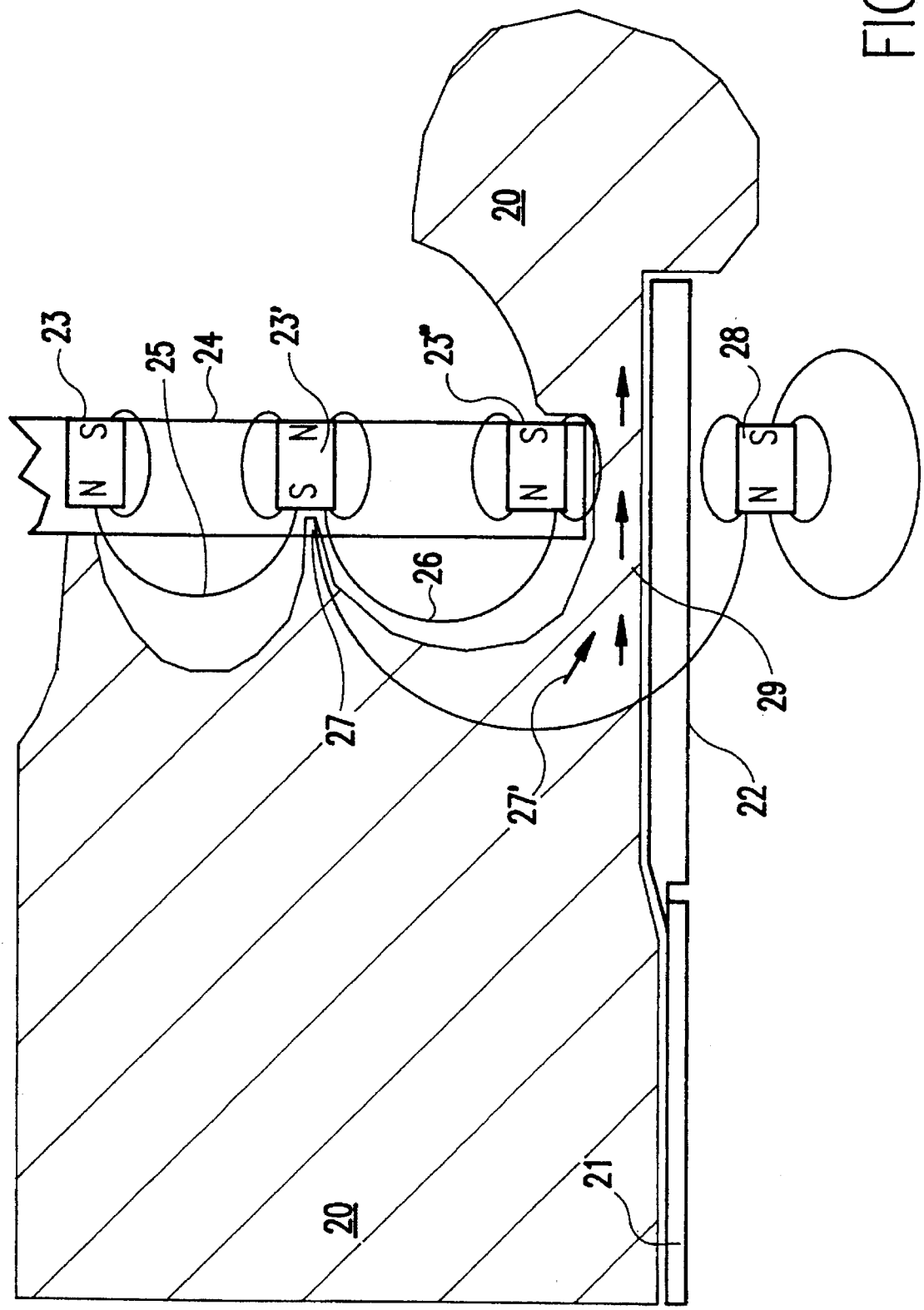
FIG. 2(a) illustrates a first embodiment according to the present invention.

Turning to FIG. 2(a), the structure of the first embodiment according to the invention is illustrated, and is for use with a plasma processing apparatus similar to that shown in FIGS. 1(a)–1(b). Elements shown in FIG. 1(a)–1(b) which are not required for a full understanding of the invention, have been omitted from FIG. 2(a) for the sake of clarity.

Examining the structure of the invention in more detail, a workpiece 21 to be processed (e.g., a semiconductor wafer made of silicon or the like) by the plasma 20 in the chamber (unillustrated) is held by a clamping member 22 which may be a mechanical clamp or an electrostatic clamp, both of which are suitably known in the art.

A plurality of multipole magnets 23, 23', 23", are suitably arranged on respective portions of a wall member 24 to have a ring cusp configuration. The wall member 24 is structurally formed such that each of the magnets are preferably separated by a predetermined distance (e.g., preferably slightly smaller than the distance between the magnet and the object) from each other and such that the strength of the magnetic fields decreases exponentially towards the wafer. The distance between adjacent ones of the magnets should be less than the distance between the wafer and the multipole magnet closest to the wafer. The magnets preferably comprise rare earth metals-cobalt alloys, neodymium iron boron, ceramic or aluminum/nickel alloys and may be embedded in or simply positioned on the respective wall member portions.

The magnetic orientation of the multipole magnets is alternated therebetween such that south and north poles of a first magnet 23 face north and south poles of a second, adjacent magnet 23', respectively. Arc-shaped magnetic fields 25, 26 are generated between magnets 23 and 23' and between magnets 23' and 23", respectively. A cusp 27 is formed at magnets 23 and 23'. A weak cusp 27' is also formed as shown in FIG. 2(a). Preferably, the integral of the magnetic fields 25, 26 over the distance perpendicular to the field should be large compared to the 50–100 Gauss*cm range. For example, the magnetic fields preferably have a strength of approximately 1000 Gauss at the cusp of the plasma and 2000 Gauss at the magnet face.

A magnet 28 is also provided such that the clamp is interposed between the magnet 28 and the lowermost multipole magnet shown above the clamp, i.e., the third magnet 23" in the example shown in FIG. 2(a). The magnet 28 may be formed as part of the underside of the clamping member or may be formed separately therefrom and be clamped to the clamping member, or may be part of a wall structure. The poles of the magnet 28 are opposed to like poles in the third magnet 23", so that an "opening" (e.g., positioned at the weak cusp 27', as discussed in further detail below) is formed in the magnetic fields.

A pumping aperture 29 for pumping fluid (i.e., a neutral gas or the like) is preferably provided substantially near the weak cusp or opening for causing the gas to flow and entrained particulates to flow through the aperture from the chamber into an antechamber (e.g., similar to chamber 15 in FIG. 1(a)). The aperture 29 includes an orifice through which the pumping fluid is pumped. The orifice is preferably positioned substantially at or near the opening. The neutral gas may be an electronegative gas (e.g., a gas having a higher ion density than an electron density) such as $CF_4$, $CHF_3$, $Cl_2$, HBr or $O_2$. The pump may have a plurality of different and/or variable pumping pressures for accommodation of a plurality of different plasma types and different size contaminants and can be arranged with various different sensing mechanisms for sensing plasma flows.

The pump's orifice is suitably positioned adjacent the plasma flow and at a position below the multipole magnets at which the plasma flow stagnates. The plasma sheath prevents particulates from going through it. The inventive system avoids sharp edges of the plasma in that a diffuse boundary is maintained in the plasma such that particle flow will not be limited by a plasma sheath. Accordingly, when the plasma slows down, the pumping of the fluid sweeps (or draws) the plasma flow and the particulates therein away from the wafer through the "hole" or opening in the field and out from the system.

As a result of such a structure, magnetic fields are formed having the lines of force illustrated. With such an orientation, the plasma flow is as shown and is positioned to be at an orifice of a mechanism for pumping fluid (i.e., a neutral gas or the like) such that as the plasma reaches a position below the multipole magnets, the plasma flow will stagnate. However, since the orifice of the pumping mechanism is located at the stagnation point of the plasma flow, the resulting flow of neutral gas or the like from the pumping mechanism continues to sweep the particulates past the stagnation point of the plasma flow, thereby effectively preventing or reducing the contamination of the wafer being processed. As mentioned above, such a method and apparatus are effective in preventing contamination in objects having any size and in removing particulates from the plasma, thereby rendering the object substantially free of contaminating particulates.

Figure 2B:
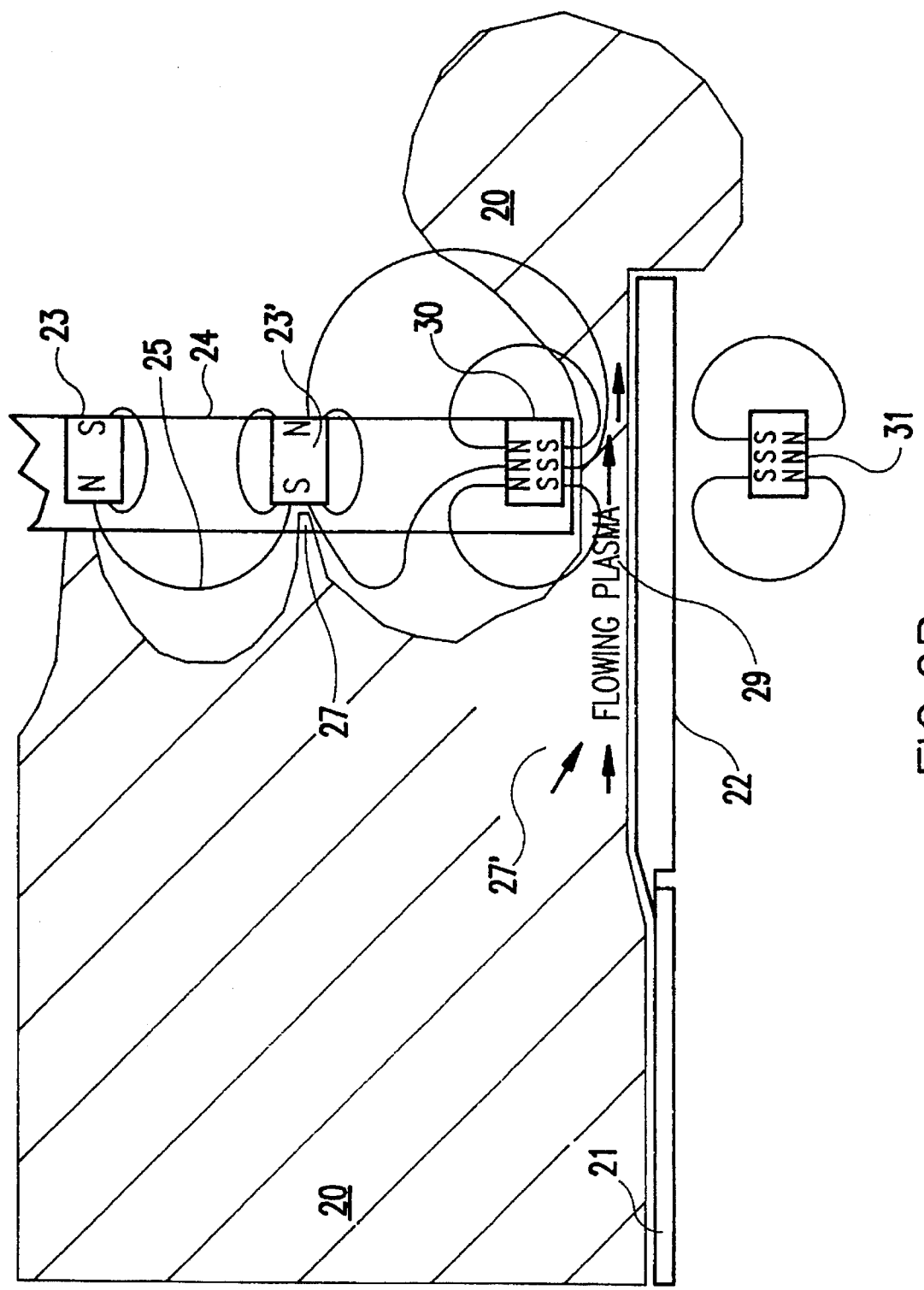
FIG. 2(b) illustrates a modification of the embodiment in FIG. 2(a)
Figure 7:
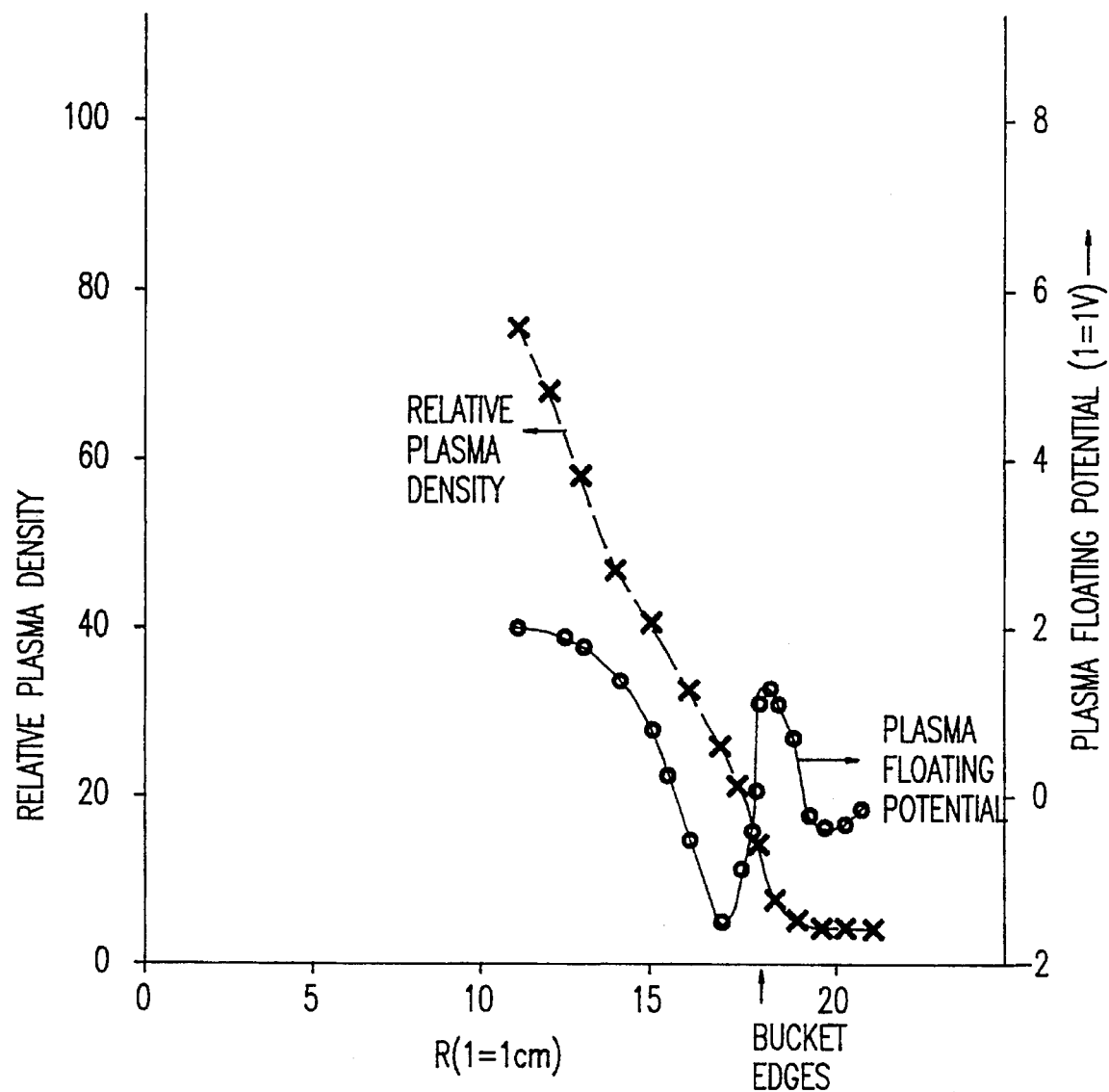
FIG. 7 illustrates the relationship of the plasma density and the associated electrical fields which exist near the pumping aperture in the structure illustrated in FIG. 2(b) having a line cusp configuration.

FIG. 2(b) illustrates a modification of the embodiment shown in FIG. 2(a) with a line cusp configuration but without the wafer clamp surface being interposed between the weak cusp. As shown in FIG. 2(b), magnets 23 and 23' are similar to that of FIG. 2(a). However, the magnet 30 has a first surface directly opposed to the wafer clamp which has a single polarity (e.g., S in the illustrated example) arrayed on the surface. A second surface has an opposite polarity (e.g., N) arrayed thereon and faces the second magnet 23'. Likewise, a magnet 30 is suitably arranged below the wafer clamp such that the surface of magnet 31 facing a surface of magnet 30 has the same polarity thereto. An aperture for pumping fluid is provided similarly to the embodiment of FIG. 2(a). This arrangement is advantageous in producing less confinement of the plasma flowing through the opening by virtue of the smaller magnetic fields perpendicular to the plasma flow. Further, as shown in FIG. 7 (described in greater detail below) such a configuration produces less electrical confinement of the plasma flow.

Figure 3A:
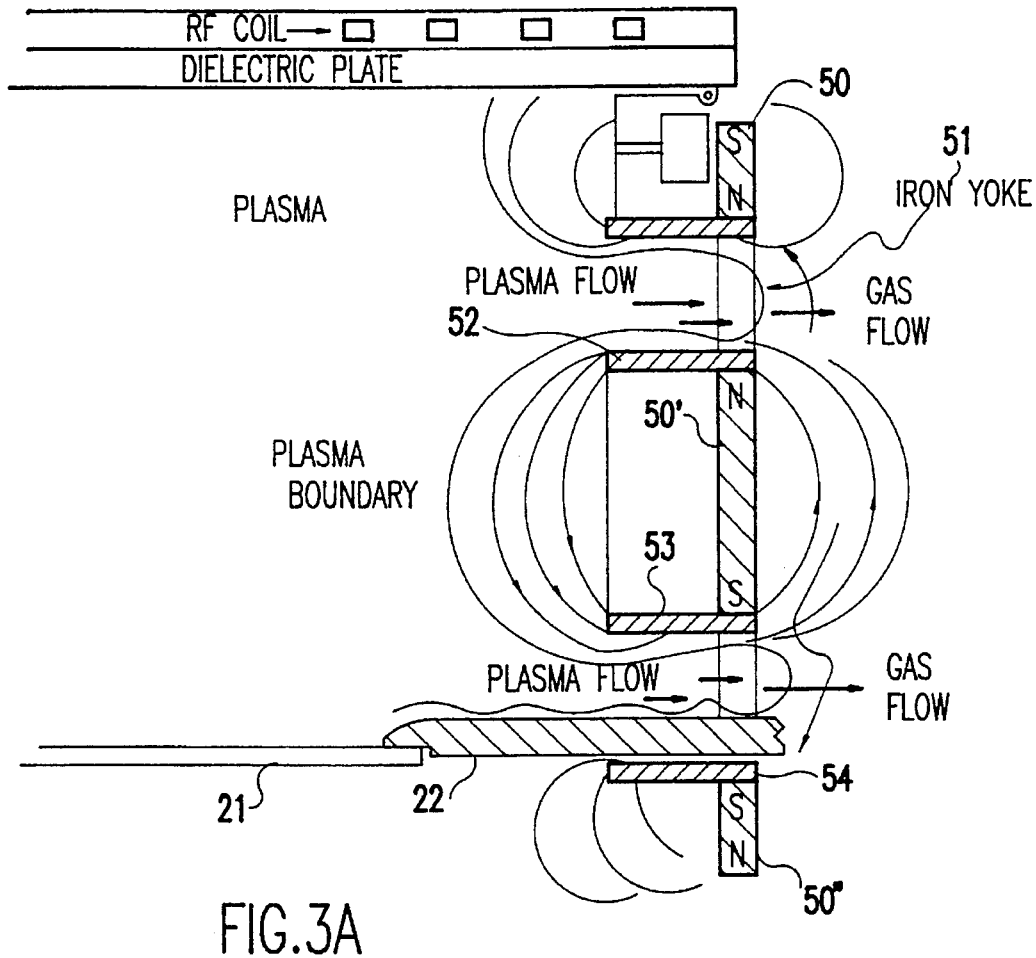
FIG. 3(a) illustrates a further modification of the invention shown in FIG. 2(a) in which magnetic fields are formed by a ring cusp arrangement of magnets to produce a plasma flow which is directed radially away from an object to be processed.

FIG. 3(a) illustrates a further modification of the embodiment shown in FIG. 2(a), in which the multipole magnets 50, 50' are mounted in a structure 51 and which can include pole pieces 52, 53 comprising iron or the like formed thereon such that a relatively strong magnetic field can be formed for confining the high energy electrons and the plasma away from the wall area of the chamber. A relatively weak "pole" is positioned near the pump aperture. A third magnet 50" is positioned with an iron pole piece as shown. The difference in magnetic strength between the strong pole and the weak pole is preferably as great as possible. For example, the strong pole preferably has a strength of 500 Gauss and the weak pole has a strength of less than 80 Gauss. As a result of the strong pole-weak pole combination, plasma will flow to the wall area near the pump aperture. An ion drag force will "pull" particulates out of the plasma to the region of the pump port where the neutral gas flow will drag the particulates through the pump port and through the weak plasma on the distal side of the apertures. The strength of the poles may be suitably adjusted to vary the magnetic field profile to achieve a desired profile for a particular plasma.

A similar effect may be achieved by using appropriate magnetic materials, such as rare earth metals-cobalt alloys, neodymium iron boron, ceramic or aluminum/nickel alloys, or a combination of the above magnetic materials, in lieu of the pole pieces.

Hence, with the invention, as the plasma reaches a position below the multipole magnets and the plasma flow stagnates, the presence of the pumping orifice located at this position advantageously enables the pumping of the neutral gas to continue to sweep the particulates past the stagnation point of the plasma flow. Thus, the workpiece is reliably kept from being contaminated by particulates. In other words, the workpiece is advantageously and reliably kept free of particulate contamination during plasma processing.

Further, it is often beneficial to provide a magnetic bucket or surface magnetic field for confining energetic electrons in a particular area of the plasma. These surface magnetic fields are the most effective if the cusps are suitably long such as 5 cm. or the like and preferably are formed as ring cusps at the outer area of a cylindrical plasma.

However, if the plasma is for plasma processing, then it is also beneficial to reduce the magnetic field to about 5 Gauss or less at the radius of the outer edge of the wafer. Prior to the present invention, solutions to these requirements were mutually exclusive since in the region in which the ring cusps stop, for example, at the plane of the wafer, the fields flare out toward the center of the plasma. However, with the present invention, such a solution has been found to satisfy both requirements.

Specifically, the invention varies the strength of the ring cusp to optimize the plasma processing. For example, the strength of the first and last pole is reduced relatively to the other poles of the ring cusps. For example, the strength of the first pole and the last pole is preferably ¼ or less of the other poles of the ring cusp which may have a strength of more than 500 Gauss. Thus, the magnetic fields are optimized for plasma processing.

Figure 3B:
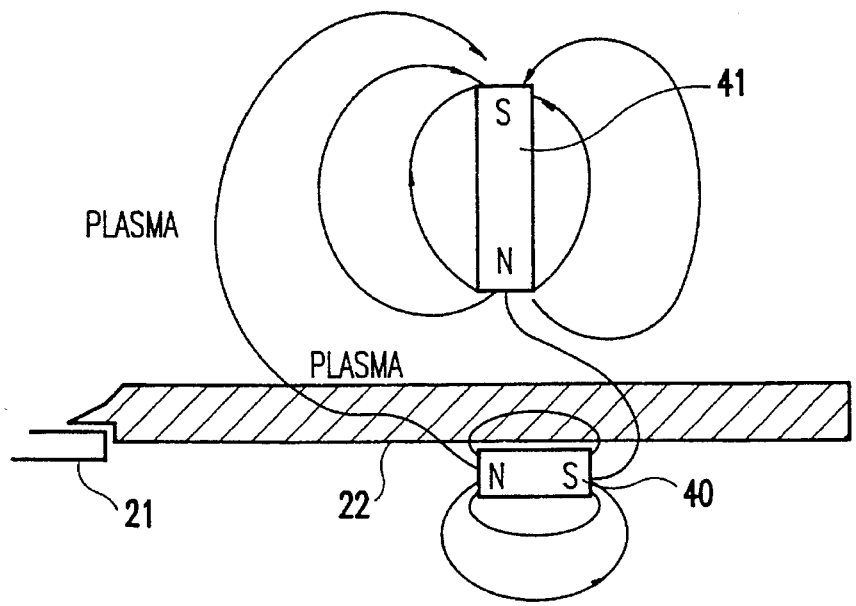
FIG. 3(b) illustrates a modification of the invention shown in FIG. 3(a)

FIG. 3(b) illustrates another configuration of the multipole magnets in which a multipole magnet 40 is positioned below the clamp. Magnet 40 has an orientation which is rotated 90 degrees from that of the orientation of the magnet shown below the clamp in FIG. 3(a), such that both poles (e.g., N and S) of the magnet below the clamp face a single pole (e.g., N) of the magnet 41 immediately above the clamp. This configuration is advantageous in that better reduction in magnetic fields in the opening results, thereby allowing the particles to move freely therethrough.

Figure 4A:
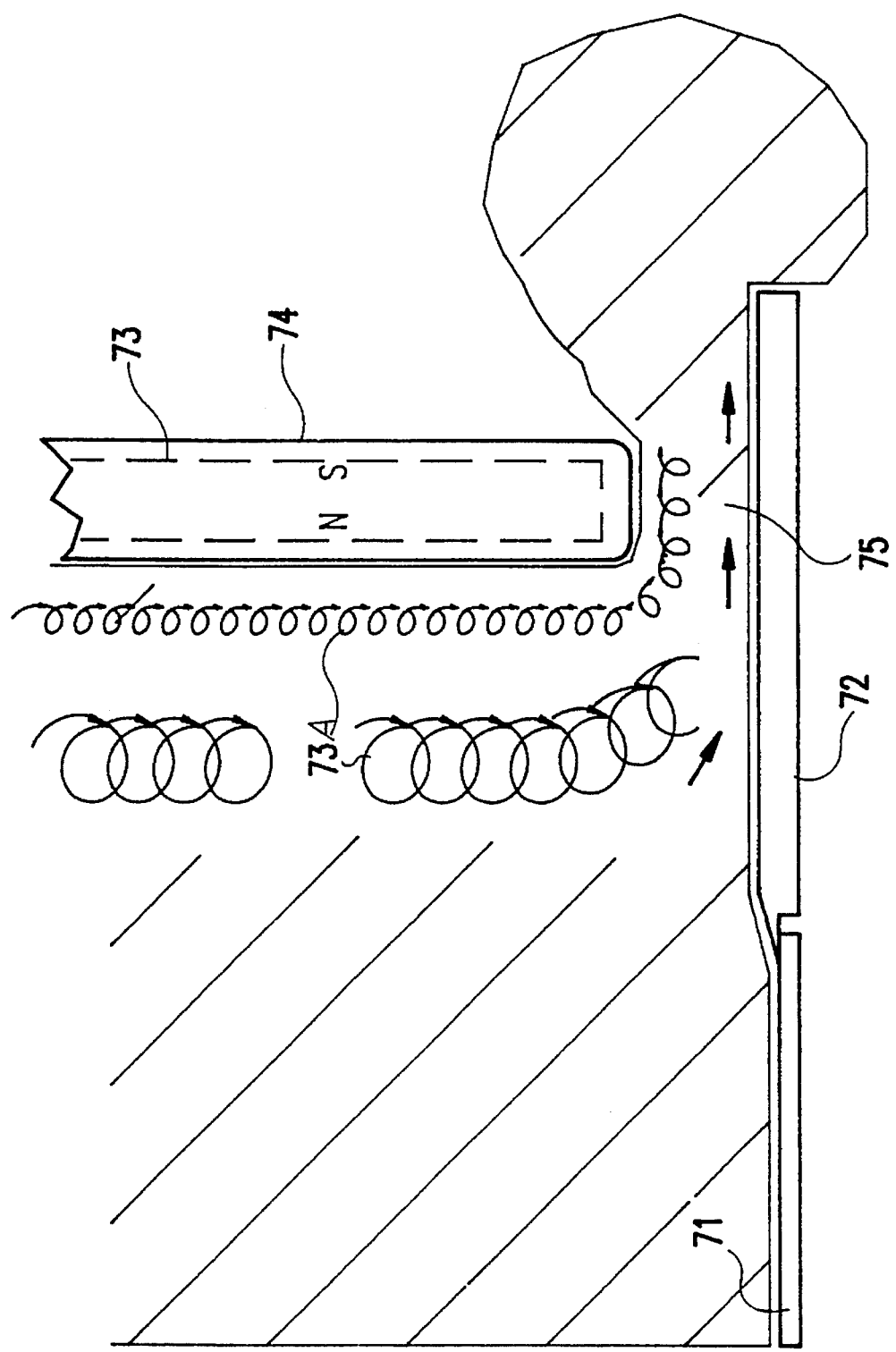
FIGS. 4(a) illustrates a second embodiment of the invention in which magnetic fields are formed by a line cusp array of magnets to produce an opening through which plasma will flow.

A second embodiment of the invention is shown in FIG. 4(a), in which a suitably arrayed magnetic configuration is used, along with lo plasma confinement by line cusps, to produce a plasma flow radially away from a substrate being processed. The configuration is advantageous for "E×B drift", which (shown as reference numeral 73a in FIG. 4(a)) serves to channel the flowing plasma through the opening. "E×B drift" is defined as the vector cross product of the electric field and the magnetic flux and is further advantageous for causing both the electrons and the ions to drift in the same direction. In this configuration, this drift causes a flow of the plasma toward the aperture. This plasma flow drags particulates along with it, away from the workpiece. The magnets 73, which are configured in a line cusp o arrangement, are suitably mounted in a wall member 74 surround the clamping member so as to produce an "opening" in the magnetic field through which plasma and entrained particulates flow, as illustrated by the arrows in FIG. 4(*a*).

Specifically, in FIG. 4*a*, the workpiece 71 (e.g., a semiconductor wafer made of silicon or the like) to be processed in a plasma chamber is clamped by the clamping member 72. A plurality of multipole magnets 73 are vertically arranged in a line cusp manner on respective portions of a wall member 74. Each of the magnets are preferably separated by a predetermined distance (e.g., such as 1.5 inches). In one example, the ring cusp may be 2 inches from the wafer and the ring cusp may have a diameter of 11 inches (the cusp having 30 magnets being separated by 1.1 inches). Thus, the magnets are preferably separated from each other, such that the strength of the magnetic fields falls off exponentially as the magnetic fields near the plasma edge. The distance between adjacent magnets should be less than the distance between the wafer and the magnets.

Figure 4B:
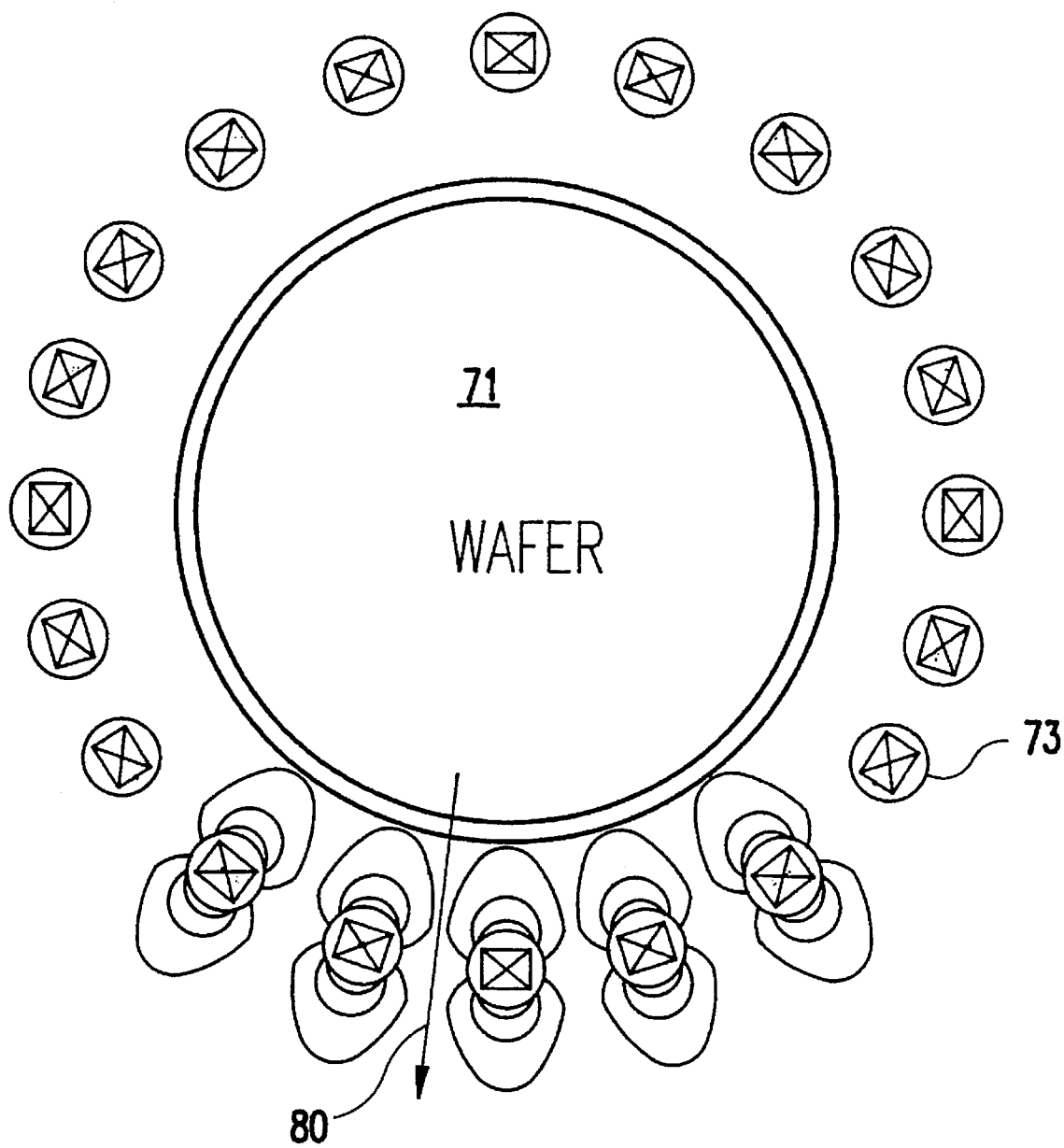
FIG. 4(b) is a plan view of a modification of the magnet configuration of the arrangement of FIG. 1(a), in which the poles are pulled apart and are turned to face each other and in which pumping apertures are inserted at the poles.

FIG. 4(*b*) illustrates a plan view of a modification of the magnet configuration of FIG. 1(*a*), in which the poles are pulled apart and turned to face each other and in which pumping apertures are inserted at the poles. FIG. 4(*b*) illustrates the line cusp magnets facing each other and the arrows represent the plasma being allowed to flow out between the magnets. More specifically, plasma flows out from the chamber at the cusp 80 formed between adjacent magnetic fields of the magnets. The advantage of this line cusp arrangement is the ease of construction as compared to the ring cusp arrangement shown in FIG. 2(*b*).

The magnets preferably comprise rare earth metals-cobalt alloys, neodymium iron boron, ceramic or aluminum/nickel alloys and may be embedded in or simply positioned on the respective wall member portions.

Similarly to the embodiments above, an aperture 75 for pumping fluid and having an orifice through which the fluid is pumped out, may be advantageously provided. The orifice is suitably positioned adjacent the plasma flow, and, more particularly, at a position below the multipole magnets proximate to the position where the plasma flow stagnates. Hence, the pumping of the fluid via aperture 75 sweeps the plasma flow and the particulates therein away.

As a result of such a structure, a channel is formed for the plasma to flow out from the chamber. With such an orientation, the plasma flow is as shown and is positioned to be at the orifice for pumping fluid such that as the plasma reaches a position below the multipole magnets and the plasma flow will stagnate. However, since the pumping orifice is located at the stagnation point, the resulting flow of neutral gas or the like continues to sweep the particulates past the stagnation point of the plasma flow, thereby effectively processing the workpiece and rendering the workpiece substantially free of undue particulate contamination.

Figure 5:
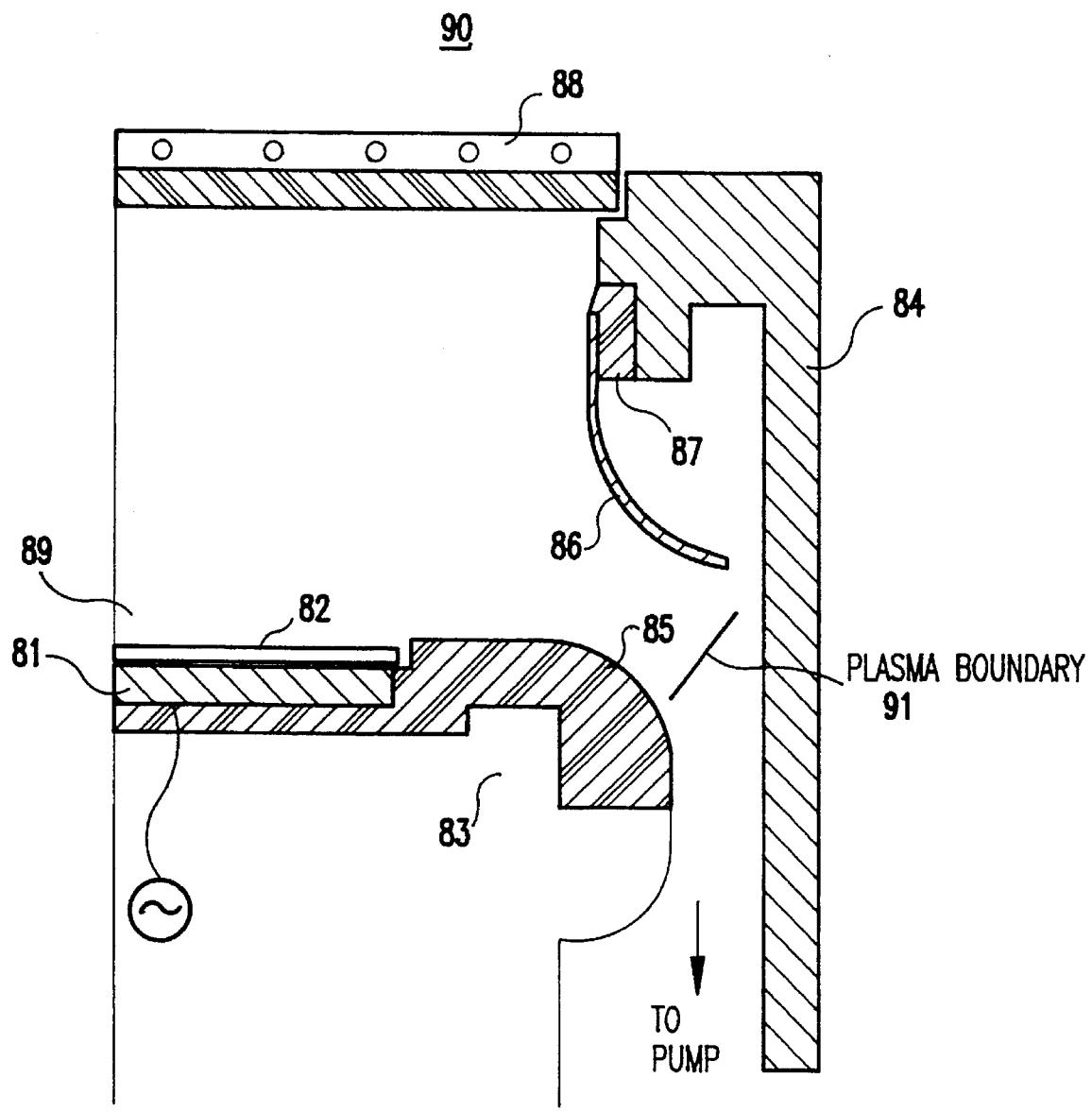
FIG. 5 illustrates a third embodiment of the invention in which plasma is produced by a radio-frequency (RF) electrode and in which fields produced by the RF electrode between the wafer and the pumping aperture are reduced.

FIG. 5 illustrates a third embodiment of the invention, in which a wafer 82 is securably held in contact to a wafer electrode 81. A plasma 89 is produced over the top of the wafer 82. Preferably, the plasma is produced by an RF coil 88 or the like. Any RF fields between the plasma and ground electrodes 83, which are produced from RF voltage on electrodes 81 and coil 88, are reduced by insulator 85. Likewise, any field between the plasma and the electrodes 83 near aperture 90 can be reduced as those to electrode 86 by isolation insulator 87. In this way, the production of the plasma in the region between the wafer and pumping aperture 90 is reduced. Thus, the plasma flows into this region and easily out of aperture 90. Preferably, the boundary of the plasma 91 outside of the aperture 90 should be diffuse so that particulates, entrained in this plasma flow, can easily flow through aperture 90. In the region near aperture 90, the particulates are also entrained in a neutral gas flow across boundary 91 and are pumped away from the wafer and out of the aperture.

Figure 6:
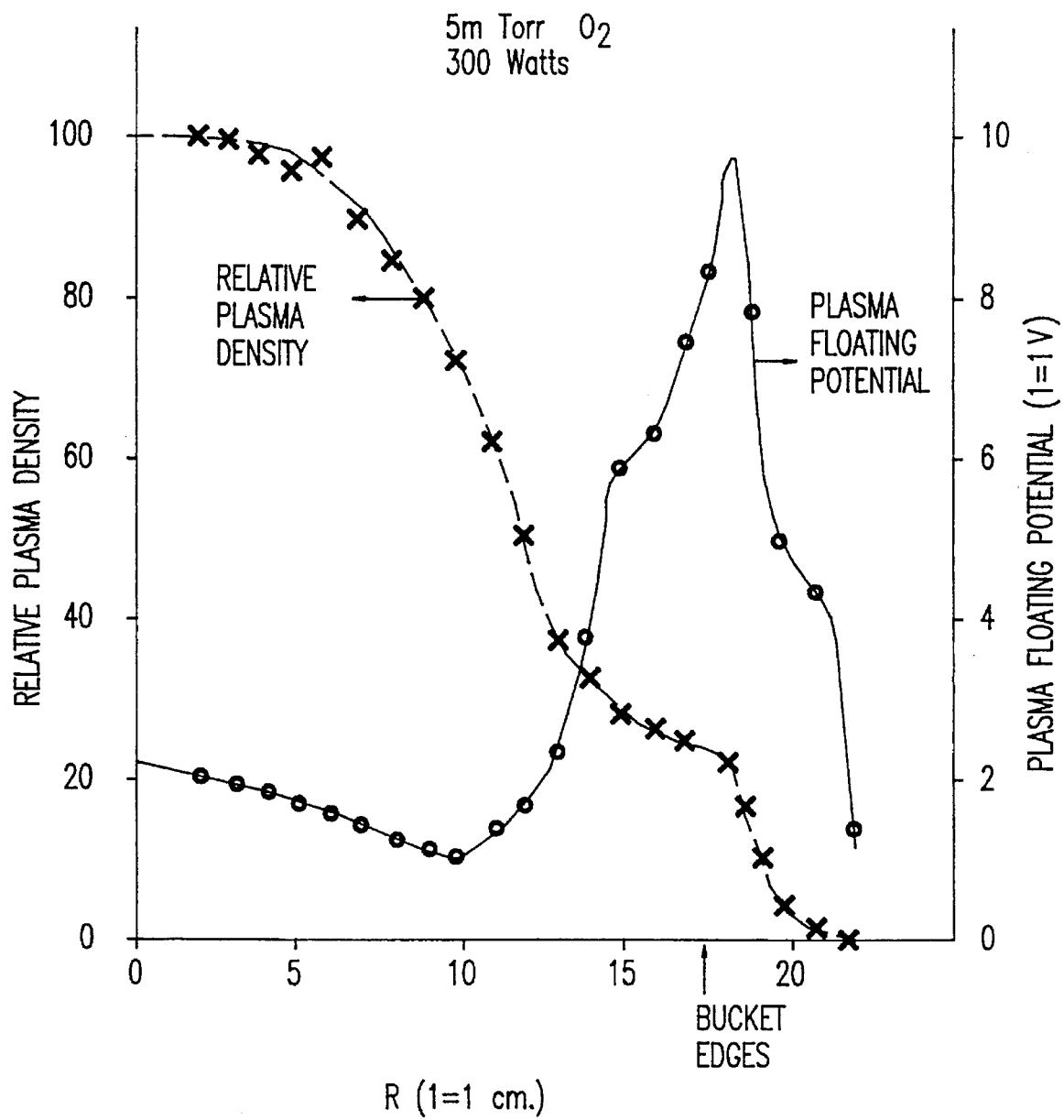
FIG. 6 illustrates the relationship of the plasma density and the associated electrical fields which exist near the pumping aperture in the structure illustrated in FIG. 1(a) and 1(b)

FIG. 6 illustrates the relationship of the relative plasma density (e.g., represented by the broken line and labelled "relative plasma density) and the floating potential (e.g., represented by the solid line and labelled "floating potential"), near the pumping aperture, to the radius R of the magnetic configuration of the known system shown in FIGS. 1(*a*)–1(*b*). Since for a flowing plasma, $dV/dx$–$KT_e$ $(dN/dx)/N$ and $KT_e$ is approximately 6 eV, the small changes in the floating potential between R=0 and 10 cm., as shown in FIG. 6, indicates that the plasma is not flowing toward the cusp. Thus, particulates will not be dragged toward the pumping aperture. For 10<R<22 cm, there is a large peak in the floating voltage which indicates that a deep particle trap exists near the peak voltage. Further, the bucket edges are as shown in FIG. 6.

FIG. 7 illustrates the relationship of plasma density and electrical fields to radius R of the magnet configuration near the pumping aperture, for the system having a line cusp arrangement similar to the configurations of FIGS. 2(*b*) and 4(*b*) according to the invention.

In contrast to the graph of FIG. 6, in FIG. 7 there is a much larger voltage variation between 0<R<17 cm. This larger voltage variation indicates that the positive ions are being pulled toward the weak cusp by this field. Thus, the plasma is flowing toward the cusp and the ion drag force drags particulates toward this cusp and the associated pumping aperture. Further, the voltage peak between 17<R<20 cm. is much smaller in FIG. 7 than that of FIG. 6 and is primarily inside the aperture. Thus, the plasma flow and gas flow will prevent the particulates from being trapped.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. In a plasma processing system used in manufacturing an object in which the object positioned in a housing is exposed to a plasma discharge, an apparatus for preventing particulate from contaminating the object, comprising:

magnetic means for generating a plasma flow adjacent the object, said plasma flow flowing toward at least one pumping aperture;

pumping means for pumping a medium, said medium supporting said plasma discharge and entraining said particulate in said plasma flow; and wall confining means being positioned adjacent said at least one pumping aperture, said magnetic means for producing a first cusp having a first strength at said at least one pumping aperture, said magnetic means comprising a plurality of magnets adjacent said at least one pumping aperture on a side opposite said object, each magnet of said plurality of magnets having a second cusp having a second strength, said first strength having a value less than that of said second strength.

2. The apparatus according to claim 1, wherein:

a magnet of said plurality of magnets which is closer to a pumping aperture of said at least one pumping aperture than other magnets of said plurality of magnets, having a strength less than a strength, of said other magnets, such that an absolute magnetic potential of said magnet having said strength less than said adjacent magnet is no more than half of that of the other magnets of said plurality of magnets.

3. The apparatus according to claim 2, wherein said magnetic means includes a line cusp of magnets for generating the plasma flow radially away from the object.

4. The apparatus according to claim 2, wherein said magnetic means includes a ring cusp of magnets for generating the plasma flow radially away from the object.

5. The apparatus according to claim 2, further comprising a second magnet positioned across said pumping aperture opposing said magnet.

6. The apparatus according to claim 5, wherein said magnet has an end having a first polarity facing said pumping aperture and said second magnet having an end having said first polarity facing said pumping aperture, thereby creating said first cusp.

7. An apparatus according to claim 5, wherein said magnet has a positive end facing said pumping aperture and said second magnet having a positive end facing said pumping aperture, thereby creating said first cusp.

8. The apparatus according to claim 5, wherein said magnet lies perpendicular to said pumping aperture and said second magnet lies perpendicular to said pumping aperture so that a positive end of said magnet lies in a first direction and a positive end of said second magnet lies in said first direction, thereby creating said first cusp.

9. In a plasma processing system used in manufacturing an object in which the object positioned in a housing is exposed to a plasma discharge, an apparatus for preventing particulate from contaminating the object, comprising:

means, operatively coupled to said housing, for generating a plasma flow adjacent the object toward a pumping aperture; and means for pumping a medium adjacent the object, said medium supporting said plasma discharge and entraining said particulate in said plasma flow away from the object, wherein said means for generating said plasma flow comprises means for generating said plasma discharge and radio frequency isolation means for eliminating plasma generation in a region adjacent said pumping aperture such that production of said plasma discharge between said object and said at least one pumping aperture is reduced and wherein a boundary of the plasma discharge in a region of said at least one pumping aperture is diffuse.

10. An apparatus according to claim 9, wherein said means for generating said plasma flow comprises means for inductively generating an electric field in said plasma.

11. In a plasma processing system used in manufacturing semiconductor circuits, wherein a semiconductor wafer is mounted on a clamping member with a chamber and is exposed to a radio frequency generated plasma discharge in the chamber, an apparatus for preventing particulate deposition on the wafer, comprising:

a housing;

magnetic means, mounted on said housing, for generating a plasma flow adjacent the wafer toward at least one aperture; and means for blowing particulates in the radio frequency generated plasma discharge above the wafer past a first point of said plasma flow, wherein said means for blowing includes means for pumping a gas flow for entrainment of the particulates through said at least one aperture, said magnetic means producing a first cusp having a first strength at said at least one pumping aperture, said magnetic means comprising a plurality of magnets adjacent said at least one pumping aperture on a side opposite said wafer, said magnetic means eliminating radio frequency generated plasma discharge generation in a region adjacent said at least one aperture such that production of said radio frequency generated plasma discharge between said wafer and said at least one aperture is reduced, each magnet of aid plurality of magnets having a second cusp having a second strength, said first strength having a value less than that of said second strength, a boundary of the radio frequency generated plasma discharge in a region of said at least one aperture being diffuse.

12. An apparatus according to claim 11, wherein said magnetic means includes a line cusp of magnets for generating a plasma flow radially away from the wafer.

13. In a plasma processing system used in manufacturing semiconductor circuits, wherein a semiconductor wafer is mounted on a clamping member with a chamber and is exposed to a radio frequency generated plasma discharge in the chamber, an apparatus for preventing particulate deposition on the wafer, comprising:

a housing;

means, mounted on said housing, for generating a plasma flow adjacent the wafer toward an aperture; and means for blowing said particulate on the wafer past a first point of said plasma flow, wherein said means for blowing includes means for pumping a gas flow for entrainment of said particulate through said aperture, wherein said means for generating a plasma flow includes means for generating a magnetic field, wherein said means for generating a magnetic field includes a line cusp of magnets for generating a plasma flow radially away from the wafer producing a first cusp having a first strength at said aperture, wherein each magnet of said line cusp of magnets has a second cusp having a second strength, said first strength having a value less than that of aid second strength.

14. In a plasma processing system used in manufacturing semiconductor circuits, wherein a semiconductor wafer is mounted on a clamping member with a chamber and is exposed to a radio frequency generated plasma discharge in the chamber, an apparatus for preventing particulate deposition on the wafer, comprising:

a housing;

means, mounted on a housing, for generating a plasma flow adjacent the wafer toward an aperture; and means for blowing said particulate in the radio frequency generated plasma discharge above the wafer past a first point of said plasma flow, wherein said means for blowing includes means for pumping a gas flow for entrainment of said particulate through said aperture, wherein said aperture is positioned at a region of said housing at which said plasma flow has a zero velocity.

* * * * *